(12) United States Patent
Nam et al.

(10) Patent No.: US 10,768,523 B2
(45) Date of Patent: Sep. 8, 2020

(54) PELLICLE FOR EUV LITHOGRAPHY AND METHOD OF FABRICATING THE SAME

(71) Applicant: S&S TECH Co., Ltd., Daegu-si (KR)

(72) Inventors: Kee-Soo Nam, Daegu-si (KR);
Chang-Hun Lee, Daegu-si (KR);
Ju-Hee Hong, Daegu-si (KR);
Chul-Kyun Park, Daegu-si (KR)

(73) Assignee: S&S TECH CO., LTD., Daegu-si (KR)

( * ) Notice: Subject to any disclaimer, the term of this patent is extended or adjusted under 35 U.S.C. 154(b) by 206 days.

(21) Appl. No.: 15/915,363

(22) Filed: Mar. 8, 2018

(65) Prior Publication Data

US 2018/0259845 A1 Sep. 13, 2018

(30) Foreign Application Priority Data

Mar. 10, 2017 (KR) .................. 10-2017-0030731
Nov. 28, 2017 (KR) .................. 10-2017-0159821

(51) Int. Cl.
*G03F 1/64* (2012.01)
*G03F 7/20* (2006.01)
*G03F 1/22* (2012.01)
*G03F 1/62* (2012.01)

(52) U.S. Cl.
CPC .............. *G03F 1/64* (2013.01); *G03F 1/22* (2013.01); *G03F 1/62* (2013.01); *G03F 7/70983* (2013.01)

(58) Field of Classification Search
CPC ..... G03F 1/22; G03F 1/62; G03F 1/64; G03F 7/70983
USPC .............................................................. 430/5
See application file for complete search history.

(56) References Cited

U.S. PATENT DOCUMENTS

| | | | |
|---|---|---|---|
| 2009/0274962 A1 | 5/2009 | Kubota et al. |
| 2009/0291372 A1 | 5/2009 | Kubota et al. |
| 2010/0102033 A1 | 4/2010 | Choi et al. |
| 2012/0045714 A1 | 2/2012 | Akiyama et al. |
| 2012/0183757 A1 | 7/2012 | Akiyama et al. |
| 2014/0370423 A1 | 12/2014 | Goldfarb |
| 2016/0147141 A1 | 5/2016 | Ono et al. |
| 2016/0334698 A1 | 11/2016 | Jeon et al. |

FOREIGN PATENT DOCUMENTS

| | | |
|---|---|---|
| JP | 2003207690 A | 7/2003 |
| JP | 2010099829 A | 5/2010 |
| JP | 2010256434 A | 11/2010 |
| JP | 2012151158 A | 8/2012 |
| JP | 2014-211474 A | 11/2014 |
| JP | 2016080967 A | 5/2016 |
| JP | 2016130789 A | 7/2016 |
| JP | 2016137089 A | 8/2016 |
| KR | 10-2009-0039653 A | 4/2009 |
| KR | 10-2009-0115657 A | 11/2009 |
| KR | 10-2009-0122114 A | 11/2009 |
| KR | 10-2012-0013931 A | 2/2012 |
| KR | 10-2012-0083208 A | 7/2012 |
| KR | 10-1624078 B1 | 5/2016 |
| KR | 10-2016-0127218 A | 11/2016 |
| KR | 10-2016-0133751 A | 11/2016 |
| TW | 201039051 A1 | 11/2010 |
| WO | 2016 001351 A1 | 7/2016 |
| WO | 2017036944 A1 | 3/2017 |

OTHER PUBLICATIONS

Office Action from Japanese Patent Office dated Dec. 18, 2018, issued in corresponding Japanese Patent Application No. 2018-030792 (3 pages with English translation).
Notice of Allowance from Japanese Patent Office dated Apr. 16, 2019, issued in corresponding Japanese Patent Application No. 2018-030792 (3 pages in Japanese).
Office action from Korean Patent Office, dated Jul. 16, 2018, in corresponding Korean application 10-2018-0028629, 17 pp. in Korean.
Office action from European Patent Office dated Jul. 30, 2018, in corresponding European application 18160280.6, 9 pp.
Article by Anonymous, "Method for a composite silicon-carbon pellicle for EUV lithography applications," JP Com. Journal, JP Com Inc., West Henrietta, NV, US, dated Jul. 29, 2004 (Jul. 29, 2004), XP013020985, ISSN: 1533-0001, cited by EPO in corresponding European application 18160280.6, dated Jul. 30, 2018, 6 pp.
Office action fromTaiwan (R.O.C.) Patent Office dated Sep. 12, 2018, in corresponding Taiwan application 107107505, 7 pp. in Chinese.

*Primary Examiner* — Christopher G Young

(74) *Attorney, Agent, or Firm* — Juan Carlos A. Marquez; Marquez IP Law Office, PLLC

(57) ABSTRACT

Disclosed are a pellicle for an extreme ultraviolet (EUV) lithography, which is excellent in transmittance of EUV exposure light and mechanical strength, and a method of fabricating the same. The pellicle includes a support layer pattern; a buried oxide layer pattern formed on the support layer pattern; and a pellicle layer provided being supported by the buried oxide layer pattern. The pellicle may further include a reinforcement layer for reinforcing the mechanical strength of the pellicle layer, an auxiliary layer for additionally supplementing the mechanical strength of the reinforcement layer, and a heat dissipation layer for dissipating heat of the pellicle layer.

40 Claims, 23 Drawing Sheets

PELLICLE FOR EUV LITHOGRAPHY AND METHOD OF FABRICATING THE SAME

CROSS-REFERENCE TO RELATED THE APPLICATION

This application claims priority from Korean Patent Applications No. 10-2017-0030731 filed on Mar. 10, 2017 and No. 10-2017-0159821 filed on Nov. 28, 2017 in the Korean Intellectual Property Office, the disclosure of which is incorporated herein by reference.

BACKGROUND

Field

The present disclosure relates to a pellicle for extreme ultraviolet (EUV) lithography and a method of fabricating the same, and more particularly to a pellicle for EUV lithography, which has high transmittance to EUV exposure light and is improved in thermal characteristics and mechanical strength, and a method of fabricating the same.

Description of the Related Art

Development of exposure technology called photolithography has made it possible for a semiconductor integrated circuit (IC) to have high integration.

A currently commercialized exposure process employs exposure equipment using an ArF wavelength range of 193 nm to perform a transfer process and form a fine pattern on a wafer, but is limited in terms of forming a fine pattern of 32 nm or less. Accordingly, there have been developed various methods such as immersion lithography, double patterning, phase shift, optical phase correction, etc. However, the exposure technology using the ArF wavelength is difficult to get a finer circuit line width narrower than or equal to 32 nm. Therefore, extreme ultraviolet (EUV) photolithography technology, in which a wavelength of 13.5 nm very shorter than the wavelength of 193 nm is used for a main exposure wavelength, has attracted attention as the next-generation process.

By the way, the photolithography process employs a photomask as an original plate for patterning, and a pattern on the photomask is transferred to a wafer. In this case, if the photomask is attached with impurities such as particles, foreign materials, etc., the impurities may damage the pattern transferred after absorbing or reflecting the exposure light and thus causes performance or yield of the semiconductor device.

To prevent the surface of the photomask from being attached with impurities, a method of attaching a pellicle to the photomask is being used. The pellicle is attached to the top surface of the photomask, and therefore dust or foreign materials on the pellicle are out of focus and not transferred to the pattern since the pattern of the photomask is in focus at a photolithography process even though impurities are attached to the pellicle. With recent fineness of the circuit line width, the size of impurities that may have an effect on the damage of the pattern is decreased, thereby increasing importance of the pellicle for protecting the photomask.

The pellicle is configured to include a pellicle layer in the form of an extremely thin film basically having a thickness of 100 nm or less for smooth and excellent transmittance of the EUV exposure light. The pellicle layer has to satisfy mechanical reliability with regard to vacuum environments and acceleration of a moving stage, and thermal reliability with regard to a long-term exposure process. Taking these conditions into account, the material and structure of the pellicle layer are determined.

A conventional pellicle fabricated by making a silicon on insulator (SOI) substrate as a thin film has a structure including the pellicle layer made of monocrystalline silicon excellent in transmittance with respect to the EUV exposure light. However, the pellicle layer made of monocrystalline silicon having crystallinity has low mechanical strength in a specific orientation, and is thus to break up during a fabrication process or during use.

SUMMARY

Accordingly, an aspect of one or more exemplary embodiments may provide a pellicle for an EUV photomask, which has high transmittance with regard to EUV exposure light, and is excellent in thermal characteristics and mechanical strength, and a method of fabricating the same.

According to one embodiment of the present disclosure, a pellicle for extreme ultraviolet (EUV) lithography includes: a support layer pattern; a buried oxide layer pattern formed on the support layer pattern; and a pellicle layer provided being supported by the buried oxide layer pattern.

According to another embodiment of the present disclosure, a pellicle for extreme ultraviolet (EUV) lithography includes: a support layer pattern; a buried oxide layer pattern formed on the support layer pattern; a pellicle layer provided being supported by the buried oxide layer pattern; and a reinforcement layer provided on the pellicle layer and reinforcing mechanical strength of the pellicle layer.

According to still another embodiment of the present disclosure, a pellicle for extreme ultraviolet (EUV) lithography includes: a support layer pattern; a buried oxide layer pattern formed on the support layer pattern; a buried reinforcement layer provided being supported by the buried oxide layer pattern; and a pellicle layer provided on the buried reinforcement layer.

According to still another embodiment of the present disclosure, a pellicle for extreme ultraviolet (EUV) lithography includes: a support layer pattern; a buried oxide layer pattern formed on the support layer pattern; a buried reinforcement layer provided being supported by the buried oxide layer pattern; a pellicle layer provided on the buried reinforcement layer; and a reinforcement layer provided on the pellicle layer and reinforcing mechanical length of the pellicle layer.

The pellicle for the extreme ultraviolet lithography according to the present disclosure may further include a heat dissipation layer provided on a upper side, a lower side or both sides of the pellicle layer.

The heat dissipation layer may be formed as a single-layered film or a multi-layered film of two or more layers. The heat dissipation layer may include at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), ruthenium compound containing B, Zr, Y, Nb, Ti, La, etc. to Ru, $B_4C$, and SiC; or a silicide material including silicon (Si) in addition to the material; or one or more materials among oxygen (O), nitrogen (N) and carbon (C) in addition to the one or more material and the silicide material.

The heat dissipation layer may have a thickness of 1 nm~20 nm.

The reinforcement layer may include at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), ruthenium compound containing B, Zr, Y, Nb, Ti, La, etc. to Ru, $B_4C$, SiC, $SiO_2$, $Si_xN_y$ (where, x and y are integers), graphene, and carbon nano tube (CNT); or a silicide material including silicon (Si) in addition to the material; or one or more materials among oxygen (O), nitrogen (N) and carbon (C) in addition to the one or more material and the silicide material.

The reinforcement layer is thinner than the pellicle layer.

The reinforcement layer may have a thickness of 1 nm~50 nm.

The pellicle layer may include monocrystalline, polycrystalline or amorphous silicon.

The pellicle layer may be doped with one or more materials among boron (B), phosphorus (P), arsenic (As), yttrium (Y), zirconium (Zr), niobium (Nb) and molybdenum (Mo).

A doping concentration for the pellicle layer is equal to or higher than $10^{10}$ ions/$cm^3$.

The pellicle layer may have a thickness of 10 nm~100 nm.

The pellicle for the extreme ultraviolet lithography according to the present disclosure may further include an auxiliary layer to additionally supplement mechanical strength of the reinforcement layer.

The auxiliary layer may include at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), ruthenium compound containing B, Zr, Y, Nb, Ti, La, etc. to Ru, $B_4C$, SiC, $SiO_2$, $Si_xN_y$ (where, x and y are integers), graphene, carbon nano tube (CNT); or a silicide material including silicon (Si) in addition to the material; or one or more materials among oxygen (O), nitrogen (N) and carbon (C) in addition to the one or more material and the silicide material.

According to still another embodiment of the present disclosure, a method of fabricating a pellicle for extreme ultraviolet lithography includes: a) preparing a substrate, which includes support layer including silicon (Si), a buried oxide layer provided on the support layer, and a pellicle layer provided on the buried oxide layer and including silicon (Si); b) forming a reinforcement layer on both sides of the substrate; c) forming a reinforcement layer pattern, through which the support layer is partially exposed, by patterning the reinforcement layer formed in the support layer; d) forming a support layer pattern, through which the buried oxide layer is exposed, by etching the support layer using the reinforcement layer etched in c) as an etching mask; and e) exposing the pellicle layer by etching the buried oxide layer using the reinforcement layer pattern and the support layer pattern as an etching mask.

According to still another embodiment of the present disclosure, a method of fabricating a pellicle for extreme ultraviolet lithography includes: a) preparing a substrate, which includes a support layer including silicon (Si), a buried oxide layer provided on the support layer, a buried reinforcement layer provided on the buried oxide layer, and a pellicle layer provided on the buried reinforcement layer and including silicon (Si); b) forming a reinforcement layer on both sides of the substrate; c) forming a reinforcement layer pattern, through which the support layer is partially exposed, by patterning the reinforcement layer formed in the support layer; d) forming a support layer pattern, through which the buried oxide layer is exposed, by etching the support layer using the reinforcement layer etched in c) as an etching mask; and e) exposing the buried reinforcement layer by etching the buried oxide layer using the reinforcement layer pattern and the support layer pattern as an etching mask.

The method may further include, after the e), etching and removing the reinforcement layer and the reinforcement layer pattern.

The method may further include, after the b), forming an oxide film on the reinforcement layer.

The reinforcement layer may include at least one material among chrome (Cr), chrome nitride (CrN), aluminum (Al), aluminum oxide ($Al_2O_3$), cobalt (Co), tungsten (W), molybdenum (Mo), vanadium (V), palladium (Pd) titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), ruthenium compound containing B, Zr, Y, Nb, Ti, La, etc. to Ru, $B_4C$, SiC, $SiO_2$, $Si_xN_y$ (where, x and y are integers), graphene, and carbon nano tube (CNT); or a silicide material including silicon (Si) in addition to the material; or one or more materials among oxygen (O), nitrogen (N) and carbon (C) in addition to the one or more material and the silicide material.

The method may further include, before the b), doping the pellicle layer with one or more materials among boron (B), phosphorus (P), arsenic (As), yttrium (Y), zirconium (Zr), niobium (Nb) and molybdenum (Mo).

The method may further include, after the e), forming a heat dissipation layer provided on a upper side, a lower side or both sides of the pellicle layer The d) may include etching the support layer through wet etching using one or more among tetramethylammonium hydroxide (TMAH), and KOH.

The wet etching may be performed at a temperature of 30° C.~90 ° C.

The wet etching may be performed by stepwise or continuously changing temperature of an etching solution.

The wet etching may be performed by two or more steps, and performed by stepwise changing the temperature of the etching solution.

The steps of the wet etching may be performed by changing the temperature of the etching solution to be decreased from a relatively high temperature to a relatively low temperature or to be increased from the relatively low temperature to the relatively high temperature, or by combination of the temperature increasing and decreasing steps.

The wet etching may be performed by stepwise or continuously changing a concentration of 1%~45% of the etching solution.

The wet etching may be performed by stepwise or continuously changing each of the temperature and concentration of the etching solution.

The reinforcement layer may be removed using an HF or BOE solution, while stepwise or continuously changing temperature and a concentration of 0.1%~10% of the etching solution.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

A pellicle for extreme ultraviolet (EUV) light according to the present disclosure is fabricated by making a silicon on insulator (SOI) substrate as a thin film. Here, the SOI substrate has a basic structure where a monocrystalline silicon layer, a buried oxide layer and a silicon substrate (i.e. a support layer) are stacked. Besides the basic structure, the SOI substrate may have alternative structures varied depending on purposes and functions, and may for example be fabricated as silicon on nitride and oxide insulator (SONOI) substrate which includes the monocrystalline silicon layer, a film with nitride, the buried oxide layer, and the silicon substrate; or as a silicon on nitride insulator (SONI) substrate which includes the monocrystalline silicon layer, the film with nitride, and the silicon substrate without the buried oxide layer of the SONOI substrate. Further, the silicon layer used as a pellicle layer in the substrate may be materialized by a monocrystalline silicon layer, a polycrystalline silicon layer, an amorphous silicon layer or a combination silicon layer of at least two or all among the monocrystalline, polycrystalline and amorphous silicon layers.

Figure 1A:
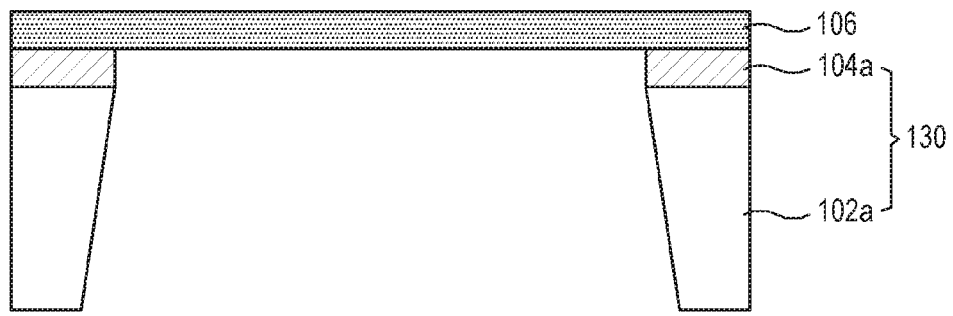
FIG. 1A is a cross-section view of a pellicle for extreme ultraviolet lithography according to a first embodiment of the present disclosure.

FIG. 1A is a cross-section view of a pellicle for extreme ultraviolet lithography according to a first embodiment of the present disclosure.

Referring to FIG. 1A, a pellicle 100 for extreme ultraviolet lithography according to a first embodiment of the present disclosure includes a frame layer 130 and a pellicle layer 106. The frame layer 130 includes a support layer pattern 102a and a buried oxide layer pattern 104a.

The support layer pattern 102a serves to support the pellicle layer 106, is formed by applying an etching process or the like to a silicon (Si) wafer, and has a thickness of 400 μm~700 μm.

The buried oxide (BOX) layer pattern 104a is buried between the support layer pattern 102a and the pellicle layer 106, is made of $SiO_2$, and has a thickness of 100 nm~1000 nm, preferably 100 nm~300 nm. After completing pellicle 100 having the structure as shown in FIG. 1, the buried oxide layer pattern 104a, together with the support layer pattern 102a, forms the frame layer 130 and functions to support the pellicle layer 106. Further, the buried oxide layer pattern 104a serves as an etching stop layer during etching for forming the support layer pattern 102a in a fabrication process for the pellicle 100. In this regard, detailed descriptions will be made along with the fabrication process to be described with reference to FIGS. 5A to 5E.

The pellicle layer 106 is materialized by a silicon layer having monocrystalline, amorphous and polycrystalline properties. To improve mechanical and thermal characteristics, the pellicle layer 106 may include one or more materials among boron (B), phosphorus (P), arsenic (As), yttrium (Y), zirconium (Zr), niobium (Nb) and molybdenum (Mo). The pellicle layer 106 is impregnated with these materials by doping, and a doping concentration at a doping process may be $10^{10}$ ions/cm$^3$.

The pellicle layer 106 has a thickness of 10 nm~100 nm, and preferably 20 nm~70 nm. As described above in the description of the related art, it is preferable that the pellicle layer 106 basically has a thickness of 100 nm or less to have good transmittance of the EUV exposure light. The thinner the pellicle layer 106, the higher the transmittance of the exposure light. However, the pellicle layer 106 preferably has a thickness of at least 10 nm to have the minimum mechanical strength for maintaining its shape. Further, an EUV photomask is typically used to not transmit but reflect the exposure light, and therefore the exposure light passes through the pellicle layer 106 twice due to transmission and reflection. To make the pellicle layer 106 absorb the exposure light by 20% or less, the pellicle layer 106 may have an optical transmittance of 90% or higher. By the way, when the pellicle layer 106 has a thickness of 100 nm or more, it is difficult to maintain the optical transmittance of 90% or higher. Thus, the thickness of the pellicle layer 106 may be less than or equal to 100 nm.

Figure 1B:
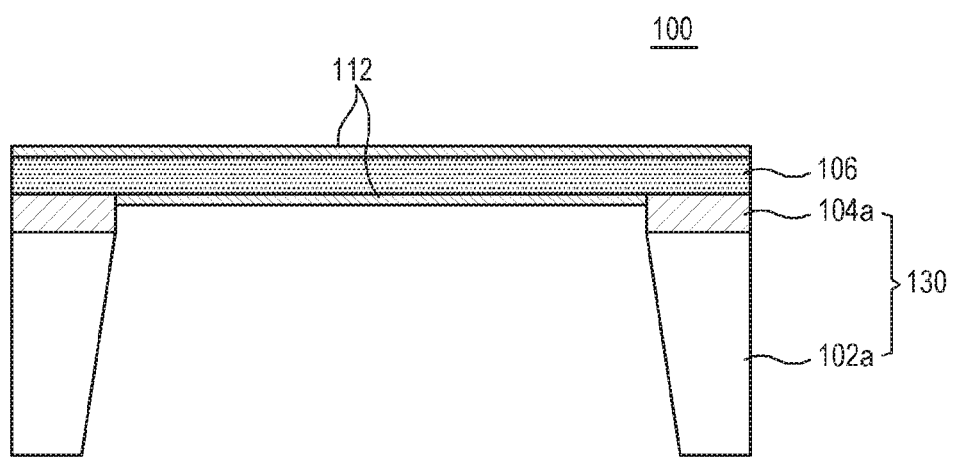
FIG. 1B is an alternative embodiment of FIG. 1A.

FIG. 1B is an alternative embodiment of FIG. 1A, in which the pellicle for the extreme ultraviolet lithography includes the frame layer 130, the pellicle layer 106 and a heat dissipation layer 112. Here, the frame layer 130 and the pellicle layer 106 are the same as those of FIG. 1A, and the heat dissipation layer 112 is formed on an upper side, a lower side or both sides of the pellicle layer 106. Further, the heat dissipation layer 112 is formed as one or more layers.

The heat dissipation layer 112 may be configured to include at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), ruthenium compound containing B, Zr, Y, Nb, Ti, La, etc. to Ru, $B_4C$, and SiC; or a silicide material including silicon (Si) in addition to the foregoing material; or one or more materials among oxygen (O), nitrogen (N) and carbon (C) in addition to the one or more materials.

The heat dissipation layer 112 may be formed as a single-layered film, or a multi-layered film of two or more layers to improve thermal, mechanical and chemical-resistant characteristics of a pellicle and to prevent surface coupling from being deteriorated due to anti-oxidation on a surface of a pellicle thin film, in which the multi-layered film may be made of one material or various materials. For example, the heat dissipation layer may be formed with a two-layered structure of Ru compound and $B_4C$ to enhance the foregoing characteristics, and the foregoing materials may be variously applied to form the heat dissipation layer.

The heat dissipation layer 112 may have a thickness of 1 nm~20 nm, and preferably a thickness of 1 nm~10 nm. The heat dissipation layer 112 restrains temperature increase on the surface of the pellicle for the extreme ultraviolet lithography at the EUV exposure process and thus lowers temperature, thereby improving thermal properties of the pellicle 100.

Figure 2A:
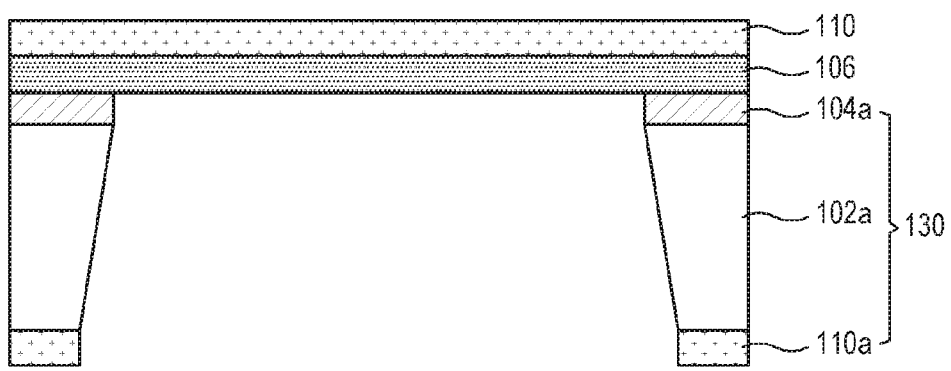
FIG. 2A is a cross-section view of a pellicle for extreme ultraviolet lithography according to a second embodiment of the present disclosure.

FIG. 2A is a cross-section view of a pellicle for extreme ultraviolet lithography according to a second embodiment of the present disclosure. In this embodiment and the following embodiments, like reference numerals will be given to like elements to those according to the embodiment shown in FIGS. 1A and 1B, and only differences in material, thickness and the like details will be described avoiding repetitive descriptions. Accordingly, for more information about elements not described in the second embodiment of FIG. 2 and the third and fourth embodiments of FIGS. 3 and 4, refer to those previously described in the foregoing embodiments.

Referring to FIG. 2A, a pellicle 200 for extreme ultraviolet lithography according to a second embodiment of the present disclosure further includes a reinforcement layer 110 on the pellicle layer 106 as compared with the pellicle 100 according to the first embodiment shown in FIG. 1A. Further, the frame layer 130 additionally includes a reinforcement layer pattern 110a beneath the support layer pattern 102a, and the reinforcement layer pattern 110a is formed by deposition for forming the reinforcement layer 110 (to be described later) in the fabrication process of FIGS. 5A to 5E.

The reinforcement layer 110 refers to a layer for reinforcing the mechanical strength of the pellicle layer 106 and prevents damage of the pellicle layer 106. The reinforcement layer 110 and the reinforcement layer pattern 110a is formed by chemical vapor deposition, sputtering, atomic layer deposition, ion beam deposition, etc.

The reinforcement layer 110 may be configured to include at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium. (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), ruthenium compound containing B, Zr, Y, Nb, Ti, La, etc. to Ru, $B_4C$, SiC, $SiO_2$, $Si_xN_y$ (where, x and y are integers); or a silicide material including silicon (Si) in addition to the foregoing material; or one or more materials among oxygen (O), nitrogen (N) and carbon (C) in addition to the one or more materials.

Further, the reinforcement layer 110 may include graphene, and a carbon nano tube (CNT). Here, the graphene and the CNT are very excellent in not only transmittance of EUV light and thus minimize decrease in the transmittance of the pellicle 200 due to the reinforcement layer 110. Besides, the graphene and the CNT are also excellent in mechanical characteristics to thereby increase the mechanical strength of the pellicle layer 106.

The reinforcement layer 110 may be thinner than the pellicle layer 106 to minimize an effect on the transmittance of the pellicle layer 106 due to the EUV exposure light. Therefore, the reinforcement layer 110 and the reinforcement layer pattern 110a have a thickness of 1 nm~50 nm, and preferably a thickness of 1 nm~10 nm.

Although it is not illustrated, an auxiliary layer may be further provided on the pellicle layer 106, and more specifically on the reinforcement layer 110. The auxiliary layer is made of one among the foregoing materials for the reinforcement layer 110, and may be made of the same material as the reinforcement layer 110. Preferably, the auxiliary layer is made of a different material from that of the reinforcement layer 110, and has a thickness of 1 nm~50 nm. The auxiliary layer functions to additionally supplement the mechanical strength that is insufficiently strengthened by the reinforcement layer 110.

Figure 2B:
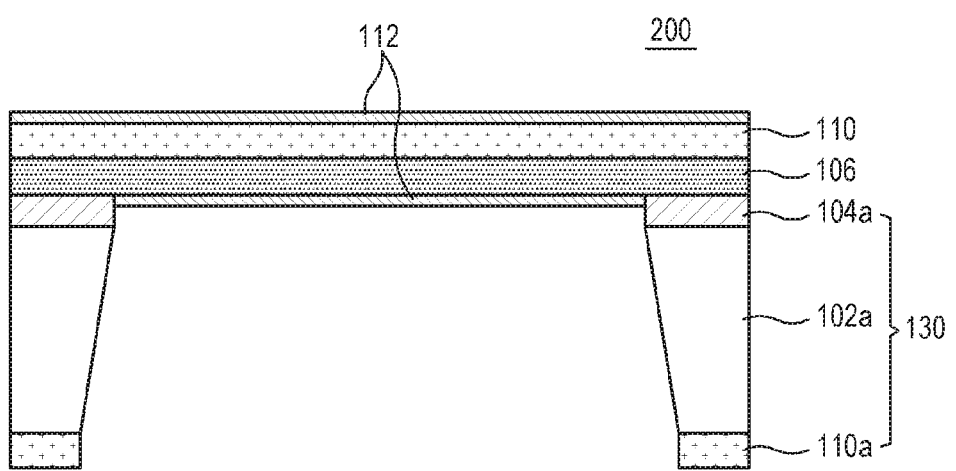
FIG. 2B is an alternative embodiment of FIG. 2A

FIG. 2B is an alternative embodiment of FIG. 2A, in which the pellicle 200 for the extreme ultraviolet lithography includes the frame layer 130, the pellicle layer 106, the reinforcement layer 110, and the heat dissipation layer 112 formed on a lower side of the pellicle layer 106, on an upper side of the reinforcement layer 110 or on both sides. Further, the heat dissipation layer 112 is formed as one or more layers. Here, the heat dissipation layer 112 is the same as that of FIG. 1B.

Figure 3A:
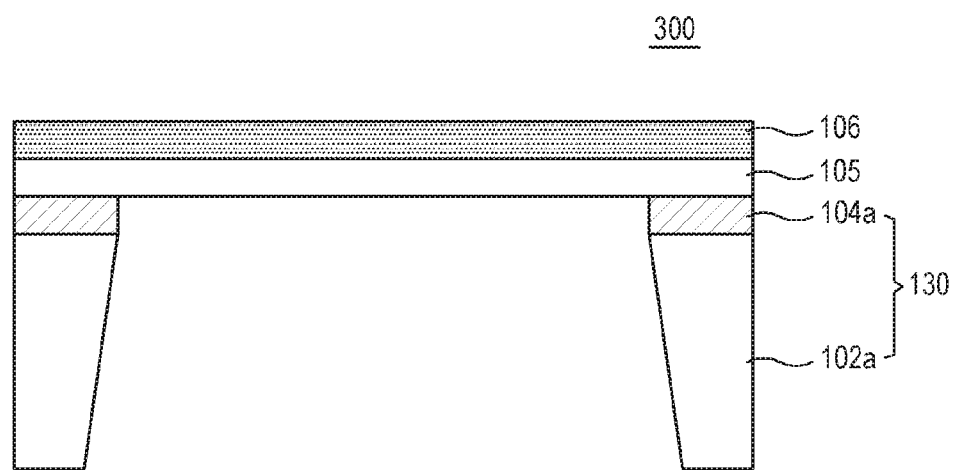
FIG. 3A is cross-section view of a pellicle for extreme ultraviolet lithography according to a third embodiment of the present disclosure.

FIG. 3A is a cross-section view of a pellicle for extreme ultraviolet lithography according to a third embodiment of the present disclosure.

Referring to FIG. 3A, a pellicle 300 for extreme ultraviolet lithography according to a third embodiment of the present disclosure further includes a buried reinforcement layer 105 between the pellicle layer 106 and a buried oxide layer 104a as compared with the pellicle 100 according to the first embodiment shown in FIG. 1A.

The buried reinforcement layer 105 may for example improve the mechanical strength of the pellicle layer 106 made of the monocrystalline silicon. Further, the buried reinforcement layer 105 may be configured to include only silicon (Si) or include one or more material among oxygen (O), nitrogen (N) and carbon (C) in addition to silicon (Si). The buried reinforcement layer 105 may be made of a material having low surface roughness and a low coefficient of absorbing the EUV exposure light.

The buried reinforcement layer 105 may have a thickness of 1 nm~30 nm, and preferably have a thickness of 1 nm~10 nm to improve the transmittance of the EUV exposure light.

Figure 3B:
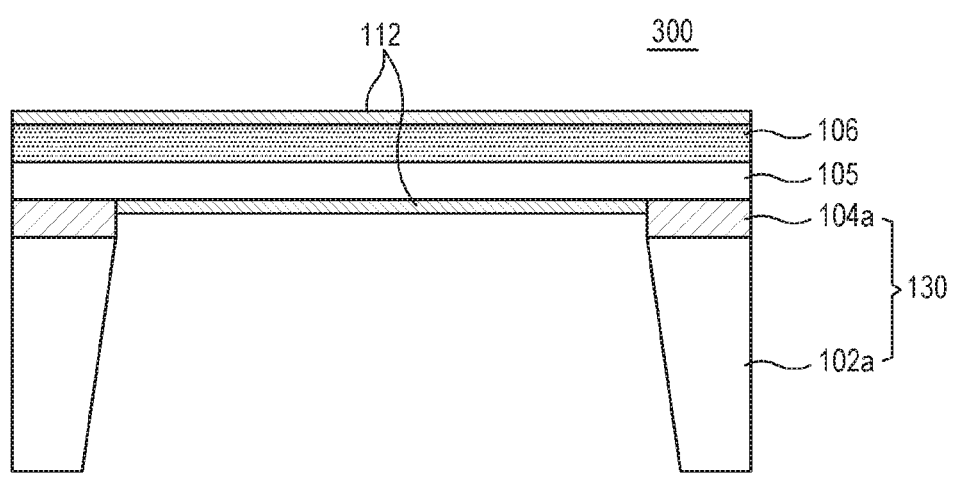
FIG. 3B is an alternative embodiment of FIG. 3A.

FIG. 3B is an alternative embodiment of FIG. 3A, in which the pellicle 300 for the extreme ultraviolet lithography includes the frame layer 130, the buried reinforcement layer 105, the pellicle layer 106, and the heat dissipation layer 112 formed on an upper side of the pellicle layer 106, on a lower side of the buried reinforcement layer 105 or on both sides. Further, the heat dissipation layer 112 is formed as one or more layers. Here, the heat dissipation layer 112 is the same as that of FIG. 1B.

Figure 4A:
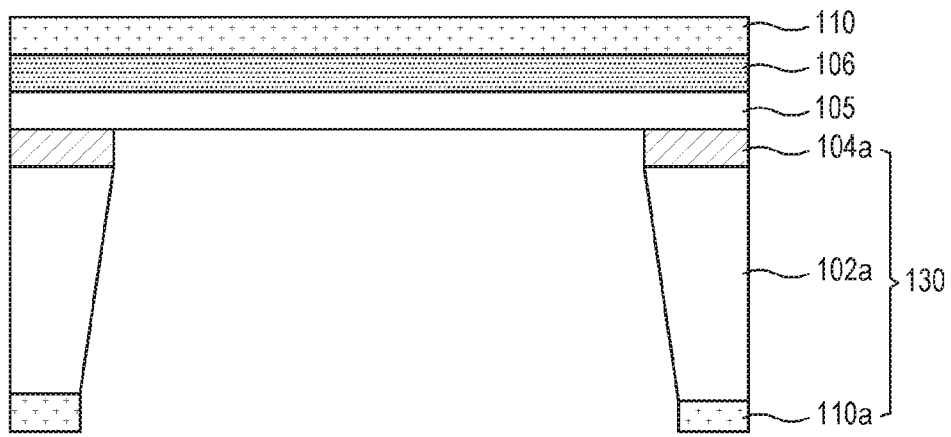
FIG. 4A is a cross-section view of a pellicle for extreme ultraviolet lithography according to a fourth embodiment of the present disclosure.

FIG. 4A is cross-section view of a pellicle for extreme ultraviolet lithography according to fourth embodiment of the present disclosure.

A pellicle 400 for the extreme ultraviolet lithography according to the fourth embodiment of the present disclosure shown in FIG. 4A includes both the reinforcement layer 110 according to the second embodiment shown in FIG. 2A and the buried reinforcement layer 105 according to the third embodiment shown in FIG. 3A.

Figure 4B:
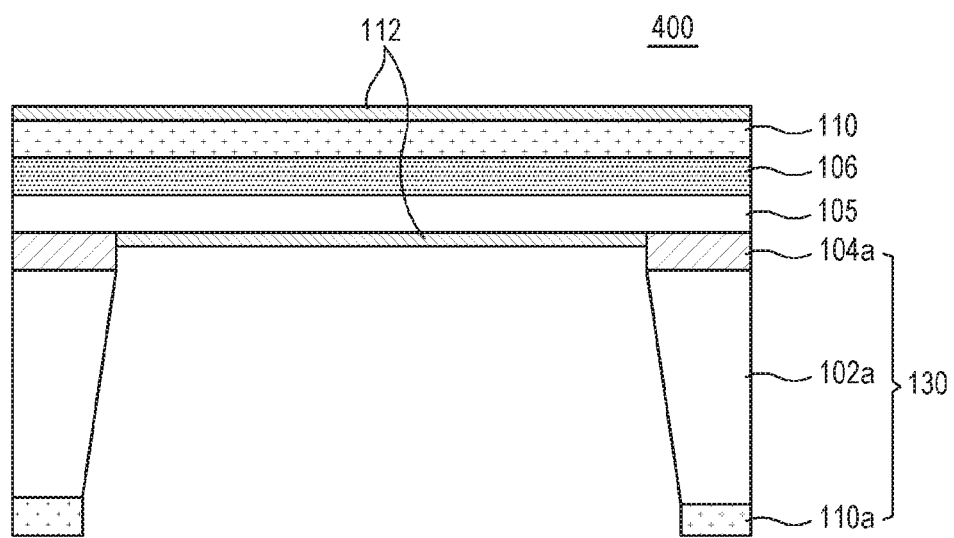
FIG. 4B is an alternative embodiment of FIG. 4A.

FIG. 4B is an alternative embodiment of FIG. 4A, in which the pellicle 400 for the extreme ultraviolet lithography includes the frame layer 130, the buried reinforcement layer 105, the pellicle layer 106, the reinforcement layer 110, and the heat dissipation layer 112 formed on an upper side of the reinforcement layer 110, on a lower side of the buried reinforcement layer 105 or on both sides. Further, the heat dissipation layer 112 is formed as one or more layers. Here, the heat dissipation layer 112 is the same as that of FIG. 1B.

FIGS. 5A to 5E are view of sequentially illustrating a method of fabricating the pellicle 200 for the extreme ultraviolet lithography according to the second embodiment shown in FIG. 2A.

Figure 5A:
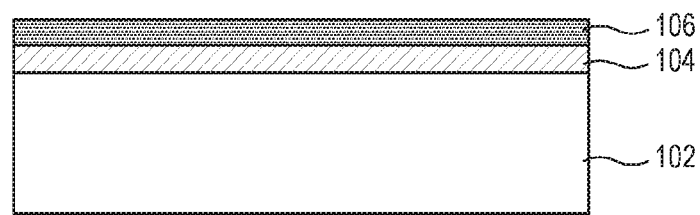
FIGS. 5A to 5E are views of sequentially illustrating a method of fabricating the pellicle for the extreme ultraviolet lithography according to the second embodiment shown in FIG. 2A.

Referring to FIG. 5A, an SOI substrate, which includes the support layer 102, the buried oxide layer 104 and the pellicle layer 106, is prepared as a base for fabricating the pellicle 200 for the extreme ultraviolet lithography according to the present disclosure. Here, the pellicle layer 106 may include one or more materials among boron (B), phosphorus (P), arsenic (As), yttrium (Y), zirconium (Zr), niobium (Nb) and molybdenum (Mo) by a doping or ion implant process to maintain a proper temperature or below at the EUV exposure light process. At the doping process, a doping concentration is equal to or higher than $10^{10}$ ions/$cm^3$. After the pellicle layer 106 is subjected to the doping and ion implant processes to contain the impurities, the monocrystalline silicon layer is changed to have amorphous or polycrystalline properties and thus improves mechanical characteristics in a specific orientation.

Figure 5B:
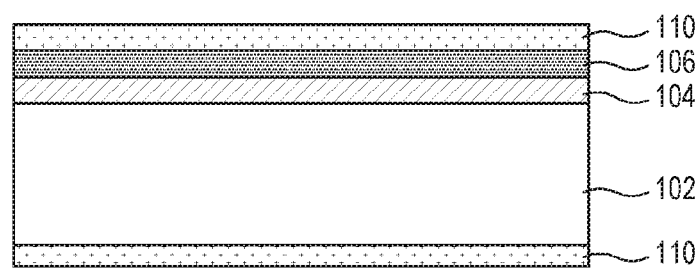

Referring to FIG. 5B, the reinforcement layers 110 are formed on the upper and lower sides of the SOI substrate. The reinforcement layer 110 may include at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), ruthenium compound containing B, Zr, Y, Nb, Ti, La, etc. to Ru, $B_4C$, SiC, $SiO_2$, $Si_xN_y$ (where, x and y are integers); or a silicide material including silicon (Si) in addition to the foregoing material; or one or more materials among oxygen (O), nitrogen (N) and carbon (C) in addition to the one or more materials.

Further, the reinforcement layer 110 may include graphene, and a carbon nano tube (CNT). Here, when the reinforcement layer 110 is fabricated using the CNT, the CNT may be formed by arc-discharge, laser vaporization, chemical vapor deposition (e.g. thermal chemical vapor deposition, plasma enhanced chemical vapor deposition, etc.), vapor synthesis, etc. In this embodiment, the plasma enhanced chemical vapor deposition of the chemical vapor deposition is used to form the carbon nano tube. The plasma enhanced chemical vapor deposition is advantageous to form the carbon nano tube at a temperature lower than that of the thermal chemical vapor deposition.

To form the carbon nano tube, iron (Fe), cobalt (Co), nickel (Ni) and the like catalyst metal are first formed as a layer to have proper thickness on the SOI substrate. According to the present disclosure, a radio frequency (RF) magnetron sputtering method is used in forming an iron (Fe) layer to have a proper thickness. Then, the substrate with the catalyst metal put into a reaction furnace of a thermal CVD system and subjected to a thermal process. Then, the carbon nano tube is grown at high temperature while carbon gas is injected into the reaction furnace after forming the catalyst metal into fine-sized nano particles. Even in case of using the graphene, when the reinforcement layer 110 is fabricated by the same method as that of using carbon nano tube.

Figure 5C:
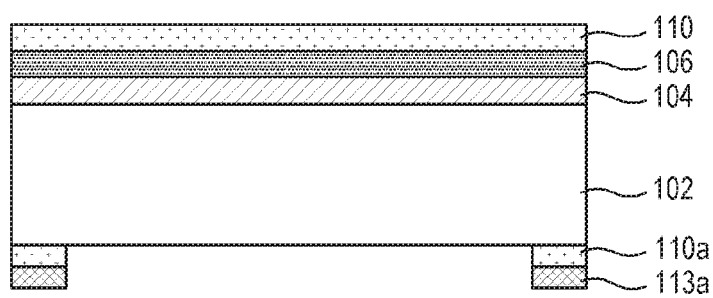

Referring to FIG. 5C, a resist film is formed on the reinforcement layer 110 formed beneath the substrate, and patterned to form a resist pattern 113a. While using this resist pattern 113a as an etching mask, the bottom reinforcement layer 110 is etched and patterned to thereby form the reinforcement layer pattern 110a through which the support layer 102 is partially exposed.

Figure 5D:
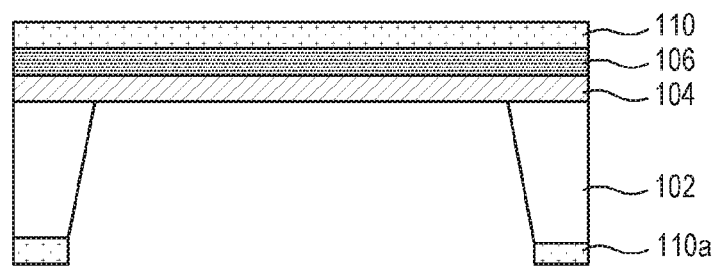

Referring to FIG. 5D, the resist pattern 113a is removed, and then the support layer 102 is etched by a dry etching process or a wet etching process using an etching solution such as KOH, tetramethylammonium hydroxide (TMAH), etc. while using the reinforcement layer pattern 110a as the etching mask, thereby forming the support layer pattern 102a through which the buried oxide layer 104 is exposed. In this case, the wet etching process is preferable, and the wet etching process is performed with an etching solution at a temperature of 30° C.~90° C., and preferably at a temperature of 40° C. ~80° C. Further, the wet etching process may be performed by stepwise or continuously changing the temperature of the etching solution. For example, the wet etching may be performed by two or more steps, and the temperature of the etching solution may be varied depending on the steps. The steps of the wet etching may be performed by relatively changing the temperature of the etching solution to be decreased from a high temperature to a low temperature or to be increased from the low temperature to the high temperature, or by combination of the temperature increasing and decreasing steps. In addition, the etching solution for the wet etching may be stepwise or continuously changed in concentration as well as the temperature, using a wet etching solution having a concentration of 1%~45%, and particularly 20%~30%.

If the buried oxide layer 104 is not present, the pellicle layer 106 may be damaged while the support layer 102 is etched since both the support layer 102 and the pellicle layer 106 contain silicon (Si). The buried oxide layer 104 serves as the etching stop layer and therefore the pellicle layer 106 is protected from an etching material while the support layer 102 is etched. By the way, the upper side of the pellicle layer 106 is protected from the etching material for the support layer 102 by the reinforcement layer 110.

Figure 5E:
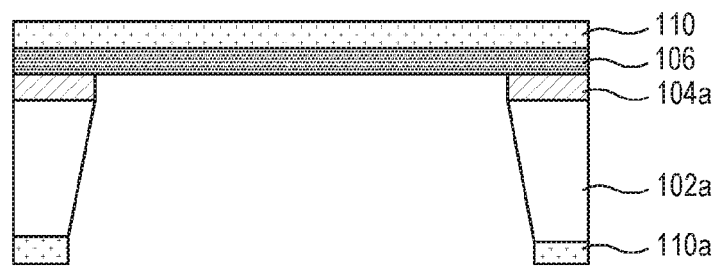

Referring to FIG. 5E, the reinforcement layer pattern 110a and the support layer pattern 102a are used as the etching mask for etching the buried oxide layer 104 by the dry or wet etching process to form the buried oxide layer pattern 104a, through which the pellicle layer 106 is exposed, thereby completely fabricating the pellicle 200 for the extreme ultraviolet lithography according to the second embodiment of the present disclosure.

In addition, the reinforcement layer 110 and the reinforcement layer pattern 110a may be removed as necessary to finally complete the fabrication of the pellicle 100 for the extreme ultraviolet lithography according to the first embodiment of the present disclosure. In case of the pellicle 100 according to the first embodiment, the reinforcement layer 110 is not present on the pellicle layer 106, and therefore there are no needs of additionally forming the reinforcement layer 110 on the upper and lower sides of the substrate unlike the process of FIG. 5B. However, when the process is performed to form the reinforcement layer 110 as shown in FIG. 5, the reinforcement layer 110 is formed on the pellicle layer 106, and serves as the etching stop layer while the support layer 102 is etched, thereby preventing the upper side of the pellicle layer 106 from being damaged by the etching material for the support layer 102.

Accordingly, even when the pellicle 100 is fabricated to have the structure shown in FIG. 1A, the pellicle 100 may be fabricated by finally removing the upper reinforcement layer 110 and the lower reinforcement layer pattern 110a after the processes of FIGS. 5A to 5E.

FIGS. 6A to 6E are views of sequentially illustrating another method of fabricating the pellicle 200 for the extreme ultraviolet lithography according to the second embodiment shown in FIG. 2A.

The pellicle 200 for the extreme ultraviolet lithography according to the present disclosure may be fabricated using a process of further forming an oxide film 114 as compared with FIGS. 5A to FIG. 5E.

Figure 6A:
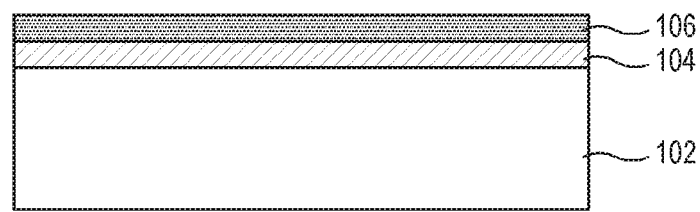
FIGS. 6A to 6E are views of sequentially illustrating a method of fabricating the pellicle for the extreme ultraviolet lithography according to the second embodiment shown in FIG. 2A.

Specifically, referring to FIG. 6A, the SOI substrate, which includes the support layer 102, the buried oxide layer 104 and the pellicle layer 106, is prepared like FIG. 5A.

Figure 6B:
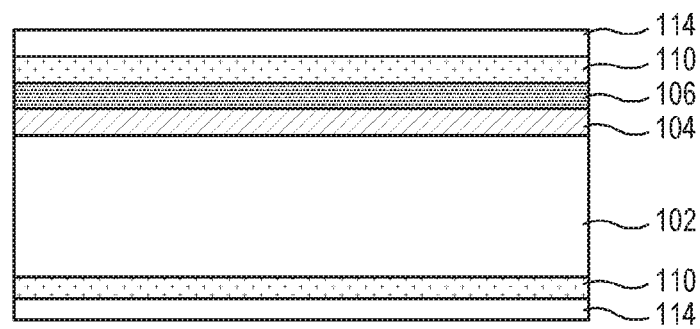

Referring to FIG. 6B, the reinforcement layer 110 of silicon nitride (SiN) is formed on the upper and lower sides of the SOI substrate by the LPCVD or the like deposition method, and then the oxide film 114 s formed on the reinforcement layer 110. The oxide film 114 is formed to prevent the reinforcement layer 110 made of silicon nitride from being damaged by a wet etching solution such as KOH, TMAH, EDP, etc., and the furnace, the CVD and the like are used in fabricating the oxide film 114.

Figure 6C:
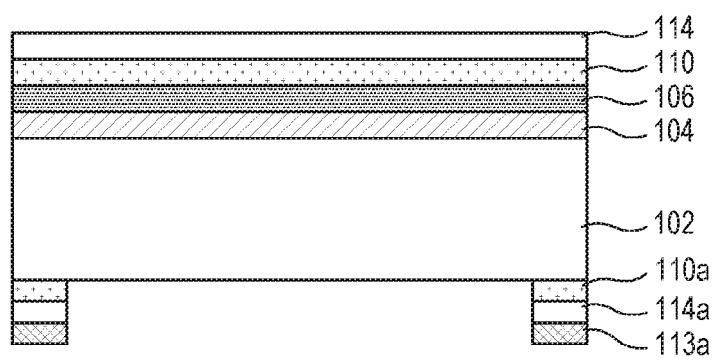

Referring to FIG. 6C, the oxide film 114 and the reinforcement layer 110 are subjected to dry etching through the resist pattern 113a like the process shown in FIG. 5C, thereby exposing the support layer 102.

Figure 6D:
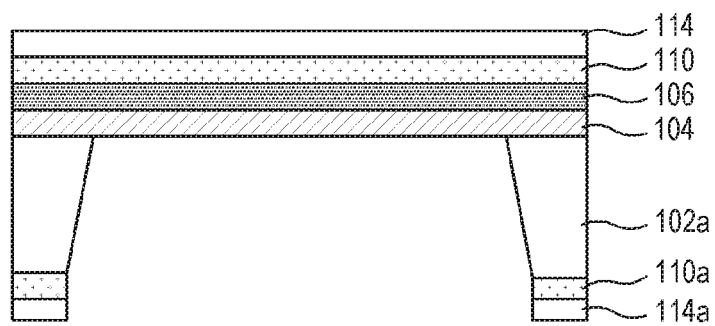

Referring to FIG. 6D, the support layer is subjected to the wet etching to expose the buried oxide layer 104 like the process shown in FIG. 5D. In this case, the wet etching process is the same as the process described with FIG. 5D.

Figure 6E:
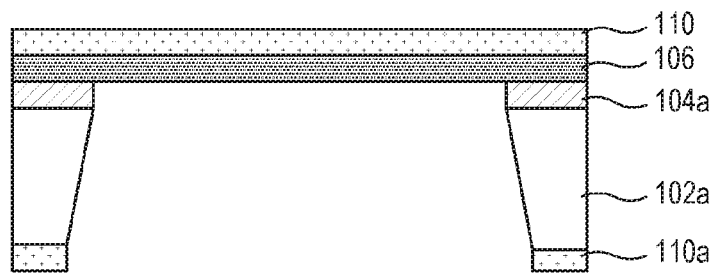

Referring to FIG. 6E, the oxide film 114a and the buried oxide layer 104 are removed from the top and bottom of the substrate by the wet etching like the process shown in FIG. 5E. In addition, when the reinforcement layer is formed as a silicon nitride film and then removed, one or more wet etching solutions among HF, BOE and a nitride solution having a concentration of 0.1%~10%, and preferably 0.2%~1% may be used, and the wet etching may be performed while stepwise or continuously changing the temperature and concentration of the etching solution.

Here, the reinforcement layer 110 and the reinforcement layer pattern 110a are removed as necessary, thereby finally completing the fabrication of the pellicle 100 for the extreme ultraviolet lithography according to the first embodiment of the present disclosure.

In addition, after the processes of FIG. 5E or FIG. 6E, the heat dissipation layer 112 may be additionally formed using one of various film growth methods with respect to the top, bottom or both sides of the pellicle layer 106, as shown in FIG. 1B and FIG. 2B.

FIGS. 7A to 7E are views of sequentially illustrating a method of fabricating the pellicle for the extreme ultraviolet lithography according to the fourth embodiment shown in FIG. 4A.

Figure 7A:
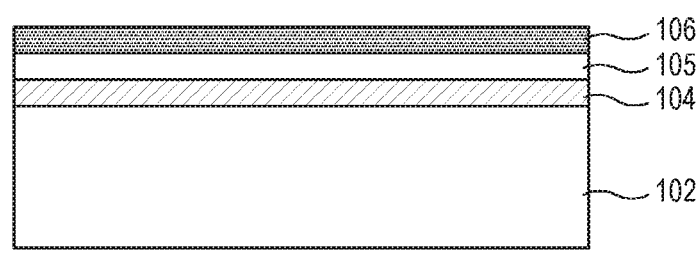
FIGS. 7A to 7E are views of sequentially illustrating a method of fabricating the pellicle for the extreme ultraviolet lithography according to the fourth embodiment shown in FIG. 4A.

Referring FIG. 7A, an SONOI substrate, which includes the support layer 102, the buried oxide layer 104, the buried reinforcement layer 105 and the pellicle layer 106, is prepared as a base for fabricating the pellicle 400 for the extreme ultraviolet lithography according to the present disclosure. Here, the SONOI substrate used as the base for fabricating the pellicle 400 may be replaced by the SONI substrate including the support layer 102, the buried reinforcement layer 105 and the pellicle layer 106 without the buried oxide layer 104. That is, according to this embodiment, even though the substrate excluding the buried oxide layer 104 is used, the buried reinforcement layer 105 functions as the etching stop layer while the support layer 102 is etched, thereby preventing the pellicle layer 106 from being damaged.

Figure 7B:
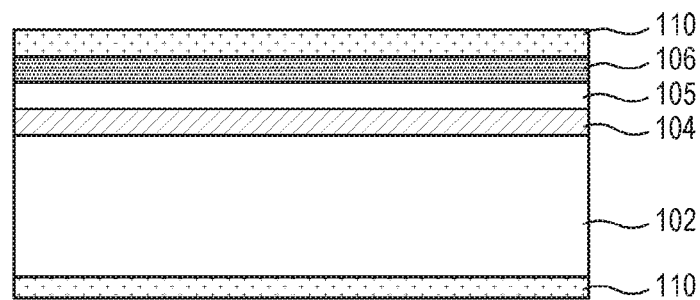
Figure 7C:
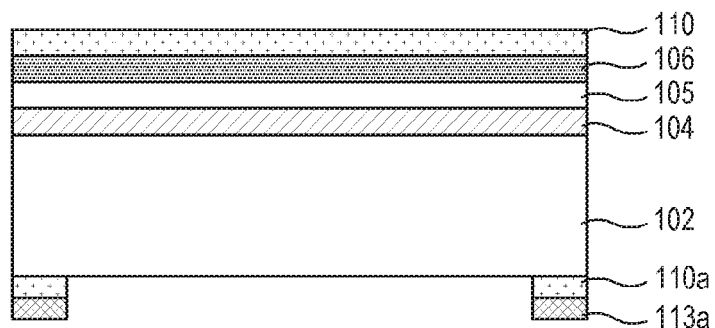
Figure 7D:
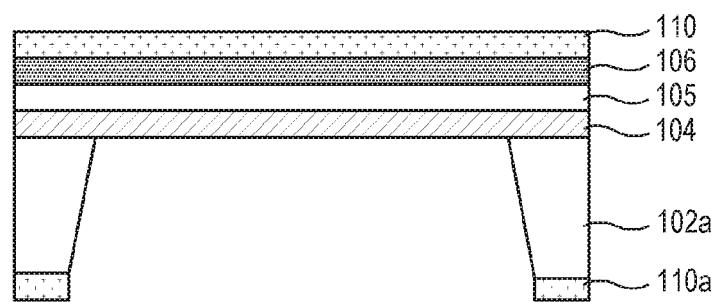

The processes shown in FIGS. 7B to 7D are the same as those of FIGS. 5B to 5D, and may be performed including a process of forming the oxide film 114 as shown in FIG. 6B.

Figure 7E:
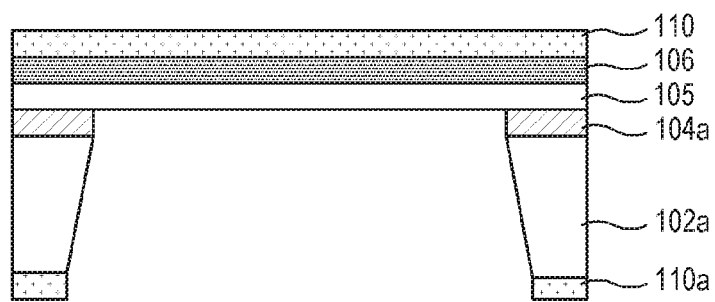

Referring to FIG. 7E, the buried oxide layer 104 is etched by the dry or wet etching process, thereby forming the buried oxide layer pattern 104a through which the buried reinforcement layer 105 is exposed. Thus, the pellicle 400 for the extreme ultraviolet lithography according to the fourth embodiment of the present disclosure is completely fabricated. Here, the reinforcement layer 110 and the reinforcement layer pattern 110a are may be selectively removed as necessary, thereby finally completing the fabrication of the pellicle 300 for the extreme ultraviolet lithography according to the third embodiment of the present disclosure.

In addition, after the processes of FIG. 7E, the heat dissipation layer 112 may be additionally formed using one of various film growth methods with respect to the top, bottom or both sides of the pellicle layer 106, as shown in FIG. 3B and FIG. 4B.

<Evaluation of Transmittance in each Embodiment>

The pellicles 100, 200, 300 and 400 were fabricated according to the first to fourth embodiments of the present disclosure, and the transmittance of each structure with regard to the EUV exposure light was evaluated using a coherent scattering microscope (CSM). As results of the evaluation, the pellicles 100, 200, 300 and 400 according to the first to fourth embodiments had transmittance of 80% or higher in a wavelength range of 13.5 nm As described above, according to an exemplary embodiment of the present disclosure, it is possible to provide a pellicle for EUV lithography, which is excellent in mechanical strength and thermal conductivity while maintaining high transmittance for EUV exposure light with the minimum thickness.

Although a few exemplary embodiments of the present disclosure have been shown and described in details with reference to the accompanying drawings, the embodiments are given for only illustrative purposes without limiting the meaning and scope of the present disclosure defined in the appended claims. Therefore, it will be appreciated by a person having an ordinary skill in the art that various changes and equivalents may be made in these exemplary embodiments. Thus, the scope of the present disclosure has to be defined by technical matters of the appended claims.

What is claimed is:

1. A pellicle for extreme ultraviolet (EUV) lithography, the pellicle comprising:
   a support layer pattern;
   a buried oxide layer pattern provided on the support layer pattern;
   a pellicle layer provided on the buried oxide layer pattern; and a heat dissipation layer provided on an upper side, a lower side or both sides of the pellicle layer.

2. The pellicle according to claim 1, further comprising a reinforcement layer provided on the pellicle layer and reinforcing mechanical strength of the pellicle layer.

3. The pellicle according to claim 1, further comprising a buried reinforcement layer provided being supported by the buried oxide layer pattern.

4. The pellicle according to claim 1, wherein the heat dissipation layer is formed as a single-layered film or a multi-layered film of two or more layers.

5. The pellicle according to claim 1, wherein the heat dissipation layer comprises at least one material among chrome (Cr), aluminum (Al), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), $B_4C$, and SiC; or a silicide material including silicon (Si) in addition to the material;

or one or more materials among oxygen (O), nitrogen (N) and carbon (C) in addition to the one or more material and the silicide material.

6. The pellicle according to claim 1, wherein the heat dissipation layer has a thickness of 1 nm~20 nm.

7. The pellicle according to claim 2, wherein the reinforcement layer comprises at least one material among chrome (Cr), aluminum (Al), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), $B_4C$, SiC, $Si_xN_y$ (where, x and y are integers), graphene, and carbon nano tube (CNT); or a silicide material including silicon (Si) in addition to the material; or one or more materials among oxygen (O), nitrogen (N) and carbon (C) in addition to the one or more material and the silicide material.

8. The pellicle according to any one of claim 2, wherein the reinforcement layer has a thickness of 1 nm~50 nm.

9. The pellicle according to claim 1, wherein the pellicle layer comprises monocrystalline, polycrystalline or amorphous silicon.

10. The pellicle according to claim 1, wherein the pellicle layer is doped with one or more materials among boron (B), phosphorus (P), arsenic (As), yttrium (Y), zirconium (Zr), niobium (Nb) and molybdenum (Mo).

11. The pellicle according to claim 1, wherein a doping concentration for the pellicle layer is equal to or higher than $10^{10}$ ions/cm$^3$.

12. The pellicle according to claim 1, wherein the pellicle layer has a thickness of 10 nm~100 nm.

13. The pellicle according to claim 2, further comprising an auxiliary layer to additionally supplement mechanical strength of the reinforcement layer.

14. The pellicle according to claim 13, wherein the auxiliary layer comprises at least one material among chrome (Cr), aluminum (Al), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), silicon (Si), ruthenium (Ru), $B_4C$, SiC, $Si_xN_y$ (where, x and y are integers), graphene, carbon nano tube (CNT); or a silicide material including silicon (Si) in addition to the material; or one or more materials among oxygen (O), nitrogen (N) and carbon (C) in addition to the one or more material and the silicide material.

15. A method of fabricating a pellicle for extreme ultraviolet lithography, the method comprising:
   a) preparing a substrate, which comprises a support layer comprising silicon (Si), a buried oxide layer provided on the support layer, and a pellicle layer provided on the buried oxide layer and comprising silicon (Si);
   b) forming a reinforcement layer on both sides of the substrate;
   c) forming a reinforcement layer pattern, through which the support layer is partially exposed, by patterning the reinforcement layer formed in the support layer;
   d) forming a support layer pattern, through which the buried oxide layer is exposed, by etching the support layer using the reinforcement layer etched in c) as an etching mask; e) exposing the pellicle layer by etching the buried oxide layer using the reinforcement layer pattern and the support layer pattern as an etching mask; and f) forming a heat dissipation layer provided on an upper side, a lower side or both sides of the pellicle layer.

16. A method of fabricating a pellicle for extreme ultraviolet lithography, the method comprising:
   a) preparing a substrate, which comprises a support layer comprising silicon (Si), a buried oxide layer provided on the support layer, a buried reinforcement layer provided on the buried oxide layer, and a pellicle layer provided on the buried reinforcement layer and comprising silicon (Si);
   b) forming a reinforcement layer on both sides of the substrate;
   c) forming a reinforcement layer pattern, through which the support layer is partially exposed, by patterning the reinforcement layer formed in the support layer;
   d) forming a support layer pattern, through which the buried oxide layer is exposed, by etching the support layer using the reinforcement layer etched in c) as an etching mask;
   e) exposing the buried reinforcement layer by etching the buried oxide layer using the reinforcement layer pattern and the support layer pattern as an etching mask;
   f) forming a heat dissipation layer provided on an upper side, a lower side or both sides of the pellicle layer.

17. The method according to claim 15, further comprising, after the e), etching and removing the reinforcement layer and the reinforcement layer pattern.

18. The method according to claim 15, further comprising, after the b), forming an oxide film on the reinforcement layer.

19. The method according to claim 15, further comprising, before the b), doping the pellicle layer with one or more materials among boron (B), phosphorus (P), arsenic (As), yttrium (Y), zirconium (Zr), niobium (Nb) and molybdenum (Mo).

20. The method according to claim 15, wherein the d) comprises etching the support layer through wet etching using one or more among tetramethylammonium hydroxide (TMAH), KOH, and ethylene diamine and pyrocatechol (EDP).

21. The method according to claim 20, wherein the wet etching is performed at a temperature of 30° C.~100° C.

22. The method according to claim 20, wherein the wet etching is performed by stepwise or continuously changing temperature of an etching solution.

23. The method according to claim 20, wherein the steps of the wet etching are performed by changing the temperature of the etching solution to be decreased from a relatively high temperature to a relatively low temperature or to be increased from the relatively low temperature to the relatively high temperature, or by combination of the temperature increasing and decreasing steps.

24. The method according to claim 20, wherein the wet etching is performed by stepwise or continuously changing concentration of the etching solution.

25. The method according to claim 20, wherein the wet etching is performed by stepwise or continuously changing each of the temperature and concentration of the etching solution.

26. The method according to claim 16, further comprising, after the e), etching and removing the reinforcement layer and the reinforcement layer pattern.

27. The method according to claim 16, further comprising, after the b), forming an oxide film on the reinforcement layer.

28. The method according to claim 16, further comprising, before the b), doping the pellicle layer with one or more materials among boron (B), phosphorus (P), arsenic (As), yttrium (Y), zirconium (Zr), niobium (Nb) and molybdenum (Mo).

29. The method according to claim 16, wherein the d) comprises etching the support layer through wet etching using one or more among tetramethylammonium hydroxide (TMAH), and KOH.

30. The method according to claim 29, wherein the wet etching is performed at a temperature of 30° C.-90° C.

31. The method according to claim 29, wherein the wet etching is performed by stepwise or continuously changing temperature of an etching solution.

32. The method according to claim 29, wherein the steps of the wet etching are performed by changing the temperature of the etching solution to be decreased from a relatively high temperature to a relatively low temperature or to be increased from the relatively low temperature to the relatively high temperature, or by combination of the temperature increasing and decreasing steps.

33. The method according to claim 29, wherein the wet etching is performed by stepwise or continuously changing a concentration of 1%-45% of the etching solution.

34. The method according to claim 29, wherein the wet etching is performed by stepwise or continuously changing each of the temperature and concentration of the etching solution.

35. The method according to claim 15, wherein the heat dissipation layer is formed as a single-layered film or a multi-layered film of two or more layers.

36. The method according to claim 16, wherein the heat dissipation layer is formed as a single-layered film or a multi-layered film of two or more layers.

37. The method according to claim 15, wherein the heat dissipation layer comprises at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), ruthenium (Ru), ruthenium compound containing B, Zr, Y, Nb, Ti, La, to Ru, and $B_4C$; or one or more materials among oxygen (O), nitrogen (N) and carbon (C) in addition to the one or more material.

38. The method according to claim 16, wherein the heat dissipation layer comprises at least one material among chrome (Cr), chrome nitride (CrN), aluminum (Al), aluminum oxide ($Al_2O_3$), cobalt (Co), tungsten (W), molybdenum (Mo), vanadium (V), palladium (Pd), titanium (Ti), platinum (Pt), manganese (Mn), iron (Fe), nickel (Ni), cadmium (Cd), zirconium (Zr), magnesium (Mg), lithium (Li), selenium (Se), copper (Cu), yttrium (Y), indium (In), tin (Sn), boron (B), beryllium (Be), tantalum (Ta), hafnium (Hf), niobium (Nb), ruthenium (Ru), ruthenium compound containing B, Zr, Y, Nb, Ti, La, to Ru, and $B_4C$; or one or more materials among oxygen (O), nitrogen (N) and carbon (C) in addition to the one or more material.

39. The method according to claim 15, wherein the reinforcement layer is removed using an HF or BOE solution, while stepwise or continuously changing temperature and a concentration of 0.1%-10% of the etching solution.

40. The method according to claim 16, wherein the reinforcement layer is removed using an HF or BOE solution, while stepwise or continuously changing temperature and a concentration of 0.1%-10% of the etching solution.

* * * * *